United States Patent [19]

Berenz

[11] Patent Number: 4,916,498

[45] Date of Patent: Apr. 10, 1990

[54] HIGH ELECTRON MOBILITY POWER TRANSISTOR

[75] Inventor: John J. Berenz, Lawndale, Calif.

[73] Assignee: TRW Inc., Redondo Beach, Calif.

[21] Appl. No.: 239,023

[22] Filed: Aug. 29, 1988

Related U.S. Application Data

[63] Continuation of Ser. No. 854,253, Apr. 21, 1986, abandoned, which is a continuation-in-part of Ser. No. 774,499, Sep. 10, 1985, abandoned.

[51] Int. Cl.$^4$ .................................................. H01L 29/80
[52] U.S. Cl. ........................................ 357/22; 357/16
[58] Field of Search ................ 357/16, 22 A, 22 MD, 357/22 I, 22 IC

[56] References Cited

U.S. PATENT DOCUMENTS

| | | | |
|---|---|---|---|
| 4,205,329 | 5/1980 | Dingle et al. | 357/4 SL |
| 4,615,102 | 10/1986 | Suzuki et al. | 357/22 A |
| 4,635,343 | 1/1987 | Kuroda | 357/22 A |

FOREIGN PATENT DOCUMENTS 61-55969 3/1986 Japan ................................ 357/22 I Primary Examiner—William D. Larkins
Attorney, Agent, or Firm—James M. Steinberger; Ronald L. Taylor

[57] ABSTRACT

A high electron mobility transistor (HEMT) structure, and a corresponding method for its fabrication, in which the maximum power output is increased by a factor of approximately two. The structure includes a stop etch layer, which is of aluminum arsenide in the disclosed embodiment, and which functions both to facilitate selective etching during fabrication and, because of its relatively wide band-gap, as a current confinement layer during operation. Since the current confinement action has a detrimental effect in the region of the source contact of the device, by tending to raise the source resistance and the threshold voltage at which current saturation occurs, this effect is avoided by aligning the source region with an edge of the gate electrode during fabrication, to minimize the source resistance and the threshold voltage for maximum current saturation.

11 Claims, 3 Drawing Sheets

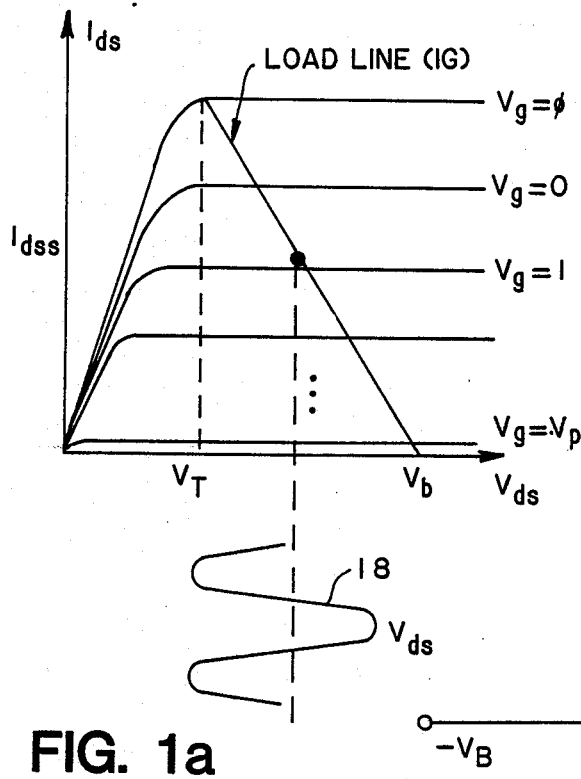
FIG. 1a
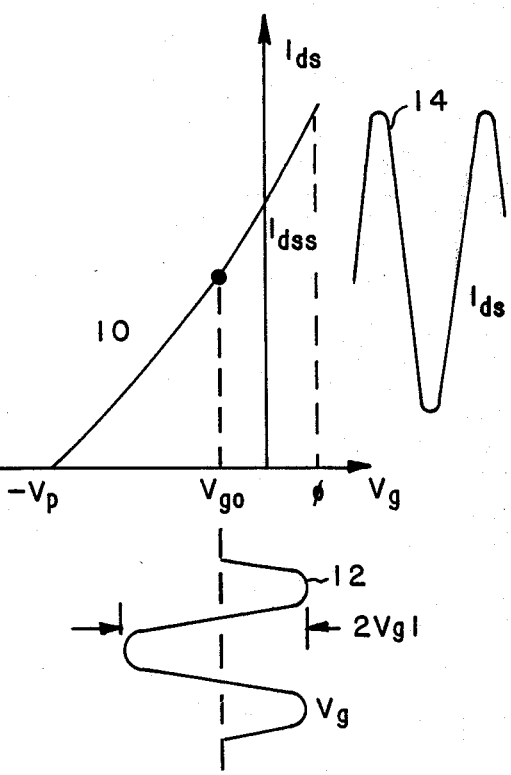
FIG. 1b
FIG. 2a
(PRIOR ART)
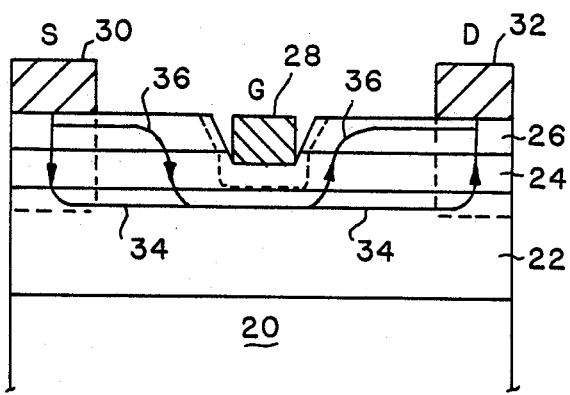
FIG. 2b
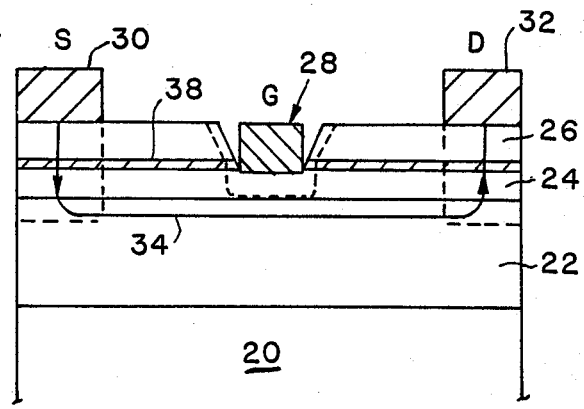

| 200 Å n-GaAs | —76 |
| 300 Å n-AlGaAs | —74 |
| 35 Å UNDOPED AlGaAs "SPACER" | —72 |
| 300 Å UNDOPED GaAs | ⟩2-DEG |
| 35 Å UNDOPED AlGaAs "SPACER" | —70 |
| 100 Å n-AlGaAs | —68 |
| | —66 |
| 0.2 μ UNDOPED AlGaAs | —64 |
| 0.2 μ UNDOPED GaAs BUFFER | —62 |
| UNDOPED LEC GaAs SUBSTRATE | —60 |

| 200 Å n-GaAs | —78 |
| | 60 Å Al s |
| 300 Å n-AlGaAs | |
| 35 Å UNDOPED AlGaAs "SPACER" | |
| 300 Å UNDOPED GaAs | —70 |
| 35 Å UNDOPED AlGaAs "SPACER" | —68 |
| 100 Å n-AlGaAs | —66 |
| 0.2 μ UNDOPED AlGaAs | —64 |
| 0.2 μ UNDOPED GaAs BUFFER | —62 |
| UNDOPED LEC GaAs SUBSTRATE | —60 |

# HIGH ELECTRON MOBILITY POWER TRANSISTOR

CROSS-REFERENCE TO RELATED APPLICATION

This application is a continuation of application Ser. No. 854,253, filed Apr. 21, 1986, now abandoned which was continuation-in-part of application Ser. No. 774,499, filed on Sept. 10, 1985, now abandoned entitled "Heterojunction Transistors with Wide Band-Gap Stop Etch Layer," by the same inventor as this application.

BACKGROUND OF THE INVENTION

This invention relates generally to high electron mobility transistors (HEMTs) and, more particularly, to such transistors used for high power applications. By way of background, a HEMT is a metal semiconductor field-effect transistor (MESFET) fabricated on a doped aluminum gallium arsenide and undoped gallium arsenide heterostructure, preferably formed by molecular beam epitaxy. When, for example, a silicon-doped aluminum gallium arsenide (AlGaAs) layer is grown on an undoped gallium arsenide (GaAs) layer, a heterojunction is formed between the two layers. A two-dimensional electron gas is formed on the GaAs side of the heterojunction due to the unique crystal structure of the heterostructure and the greater electron affinity of the GaAs. The AlGaAs layer is fully depleted of mobile charge near the heterojunction and acts like the gate oxide of a metal oxide semiconductor field-effect transistor.

When a Schottky barrier gate is deposited on the AlGaAs layer, a depletion region is formed beneath the gate. The resulting device functions as a field-effect transistor in that the Schottky barrier gate controls the number of electrons in the two-dimensional electron gas formed on the GaAs side of the heterojunction.

Carrier transport in the electron gas is similar to transport in undoped GaAs, where the electron mobility is many times greater than doped GaAs because there is little or no impurity scattering. As a result, the electrons travel at twice the saturated velocity of a conventional GaAs MESFET. Thus, ultra-high-speed digital integrated circuits can be fabricated with HEMT devices. For example, HEMT ring oscillators have been fabricated with 12-picosecond switching delays at room temperature.

In spite of the promise of HEMT devices to provide high-response speeds in digital integrated circuits, there are some significant factors that limit the application of the HEMT as a power transistor, sometimes referred to as a HEMPT. One of the principal factors limiting the power output capability of a HEMT is its relatively low gate-drain breakdown voltage in comparison to conventional GaAs power FETs. GaAs power FETs can be designed to provide a gate-drain breakdown voltage in the range 30-60 volts between the gate and drain. Current HEMT structures are only able to support 8-10 volts between the gate and drain before breaking down.

The term "breakdown" is used loosely to refer to a phenomenon of rapidly increasing drain current in response to only small increases in drain-source voltage. In a conventional GaAs FET, breakdown refers to an avalanche breakdown phenomenon, in which electron-hole pairs are generated by high-energy electrons at an edge of the gate closest to the drain. These carriers contribute to the excess drain current by which the breakdown is observed. In a HEMT device, electrons will scatter from the two-dimensional electron gas at energies much lower than are required to initiate avalanche breakdown. There is an analogous effect, however, caused by the flow of "three-dimensional" electrons outside the two-dimensional electron gas. Some of the three-dimensional electrons scatter back into the AlGaAs layer of the device and follow conduction paths parallel to the two-dimensional electrons in the gate-drain region of the transistor. Some electrons also contribute to a space-charge-limited current flow through the GaAs buffer layer of the device if they are not confined by another heterojunction barrier. The excess drain current associated with these three-dimensional electrons is responsible for a low output resistance, and it limits the maximum drain voltage that can be applied before excessive drain current flows.

It will be appreciated from the foregoing that there is a need for an improved HEMT structure for operation at high powers. Specifically, what is needed is a HEMT structure that provides for an increased gate-drain breakdown voltage as compared with HEMT structures of the prior art. The present invention satisfies this need.

SUMMARY OF THE INVENTION

The present invention resides in an improved high electron mobility transistor (HEMT) structure in which the gate-drain breakdown voltage is substantially increased, and without increase in the source resistance. The structure of the invention includes at least one heterojunction between an undoped gallium arsenide buffer layer and a doped aluminum gallium arsenide layer. There is also a cap layer over the doped aluminum gallium arsenide, a gate electrode extending through the cap layer and contacting the doped aluminum arsenide layer, and source and drain contact regions extending through the cap layer to the heterojunction.

One important aspect of the invention is the inclusion of a stop etch layer between the doped aluminum gallium arsenide layer and the cap layer. This permits the gate electrode opening to be formed without altering the thickness of the doped aluminum gallium arsenide layer, as fully disclosed in the cross-referenced application. As in a conventional HEMT device, a two-dimensional electron gas is formed on the gallium arsenide side of the heterojunction. The stop etch layer performs another important function in the power HEMT. Current flow between the source and drain contact regions is confined by the stop etch layer, which presents a barrier to leakage electron paths through the doped aluminum gallium arsenide and cap layers. The current confinement action of the stop etch layer has the effect of confining electrons to the two-dimensional electron gas at the heterojunction. This increases the drain-source voltage at which "breakdown" takes place. As will be explained in more detail, increasing the breakdown voltage results in an increased output resistance and a higher maximum power output from the transistor.

Inclusion of the stop etch layer does, however, pose a disadvantage if the HEMT structure is otherwise conventional. The source-gate resistance is increased by the inclusion of the stop etch layer, and this is manifest in a relatively lower transconductance parameter for the device. This disadvantage is avoided in the structure of the invention by providing a self-aligned selectively implanted source contact. In accordance with this aspect of the invention, the source contact region is formed in alignment with one edge of the gate electrode. Current flow from the source is then virtually directly into the two-dimensional electron gas, and the source-gate resistance is kept low by maximizing source current flow through the stop etch layer.

The same structure may be employed in conjunction with multiple heterojunctions. For example, a double heterojunction device would additionally include another doped aluminum gallium arsenide layer beneath the undoped gallium arsenide, and an undoped aluminum gallium arsenide layer between the second doped aluminum gallium arsenide layer and the buffer layer of gallium arsenide. The stop etch layer in this embodiment performs the same current confinement function as in the single heterojunction version.

As in conventional HEMT structures, there is normally a thin spacer layer of undoped aluminum gallium arsenide at each of the heterojunctions.

In accordance with the method of the invention, the structure is formed by first forming a buffer layer of undoped gallium arsenide on a substrate, then forming an epitaxial layer of doped aluminum gallium arsenide over the buffer layer, to a predetermined optimum thickness. The method further includes forming a stop etch layer over the doped aluminum gallium arsenide and forming a cap layer over the stop etch layer. The method further includes selectively etching a gate electrode opening, depositing a gate electrode in the opening, and implanting source and drain contact regions into the structure such that the source region is closely adjacent to but not in contact with the gate electrode, and the drain region is relatively widely spaced from the gate electrode.

More specifically, the method of the invention also includes the steps of forming a gate mask over the gate electrode opening, then etching the deposited gate electrode material to form a gate electrode that is undercut with respect to the gate mask. Prior to implanting the source and drain regions, the method includes the steps of depositing a resist layer over the structure, and forming source and drain region openings in the resist layer, wherein the source region is defined in part by an edge of the gate mask. After implantation, the source region is laterally separated from the gate electrode only by the depth of undercut of the gate material with respect to the gate mask. Alternatively, the gate electrode can be selectively etched away after the source implantation, to ensure a small clearance between the gate electrode and the implanted source region.

It will be appreciated from the foregoing that the present invention represents a significant advance in the field of high electron mobility transistors intended for high power applications. In particular, the invention provides a transistor structure having a current confining layer that results in a higher gate-drain breakdown voltage, and hence a higher output resistance and higher maximum power output. In addition, the use of a self-aligned source region in close proximity to the gate electrode ensures that the source-gate resistance is not increased by the presence of the current confining layer. Other aspects and advantages of the invention will become apparent from the following more detailed description, taken in conjunction with the accompanying drawings.

BRIEF DESCRIPTION OF THE DRAWINGS

FIGS. 1a and 1b are graphs together showing the characteristics of a field-effect transistor or a high electron mobility transistor operating as a Class A amplifier;

FIGS. 2a and 2b are similar sectional views of a single heterojunction HEMT without and with a stop etch layer, respectively, showing the effect of the stop etch layer on current leakage paths in the structure;

FIGS. 4a and 4b are sectional diagrams showing the epitaxial structures of a conventional double heterojunction HEMT structure without and with, respectively, a stop etch layer for current confinement.

DESCRIPTION OF THE PREFERRED EMBODIMENTS

Figure 3A:
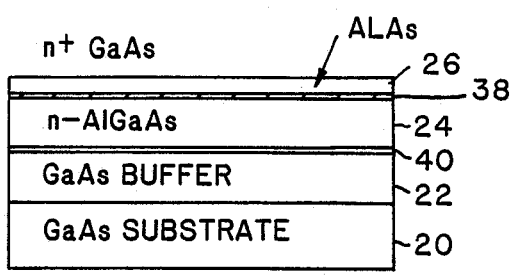
FIGS. 3a–3f are sectional views of a single heterojunction HEMT structure showing a progression of fabrication steps in accordance with the invention.

As shown in the drawings for purposes of illustration, the present invention is concerned with high electron mobility transistors (HEMTs) used for relatively high power applications. Prior to this invention, the maximum power output of such transistors has been limited by a relatively low gate-drain breakdown voltage. As will be briefly explained with reference to FIGS. 1a and 1b, the breakdown voltage directly affects the maximum power output of a HEMT.

FIG. 1b shows, by the curve 10, the relationship between drain current $I_{ds}$ and gate voltage $V_g$ in a depletion-mode HEMT. At $V_g=0$, a drain current $I_{dss}$ flows, and as the gate voltage is increased negatively, the drain current decreases in a practically linear fashion until it reaches zero at a "pinch-off" gate voltage of $-V_p$. If $V_g$ is increased positively from zero, conduction through the device is enhanced and the drain current increases to a practical maximum at a gate voltage of $\phi$, which is the barrier height of the gate Schottky barrier. FIG. 1b also shows, at 12, a sinusoidal input gate voltage having an average value at an operating or gate bias point $V_{go}$ and an amplitude $V_{g1}$. The effect of this input signal is to produce a corresponding drain current 14 of approximately sinusoidal form. This is known as Class A amplifier operation, in which an output current flows for all values of the sinusoidal input signal.

FIG. 1a shows the corresponding relationship between drain current $I_{ds}$ and drain-source voltage $V_{ds}$ for a number of gate voltages varying from $V_g=\phi$ through $V_g=-V_p$. It will be observed that the current-voltage curves increase from zero in a practically linear fashion, and then become flat in what is known as the saturation region of the curves. The voltage at which saturation is reached in the curve for $V_g=\phi$ is the threshold voltage $V_T$ for maximum current saturation. A load line 16, the slope of which is indicative of the resistance of a load circuit to which the amplifier output is connected, is shown as extending from the saturation threshold of the maximum current curve to a point at voltage $V_b$ on the voltage axis. The sinusoidal voltage curve 18 represents the output voltage from the device corresponding to the output current curve 14 and the load line 16.

The sinusoidal input voltage is of the form:

$$V_g = -V_{g0} + V_{g1} \sin \omega t.$$

The maximum power in this Class A type of operation occurs when the gate voltage swings between $-V_p$ and $+\phi$. That is, $V_{g0} = (V_p-\phi)/2$ and $V_{g1} (V_p+\phi)/2$. The maximum drain voltage possible under these conditions is:

$$V_{bmax} = V_B - V_p,$$

where $V_B$ is the breakdown voltage. From these relationships, one can derive the following expression for the maximum radio-frequency (rf) power from the device:

$$P_{rfmax} = \frac{I_{dss}(V_B - V_p - V_T)}{32} \cdot (1 + \phi/V_p)^2 \quad (1)$$

From this expression, it will be apparent that maximum rf power that can be output from the device is dependent on the breakdown voltage $V_B$. For Class B operation, a similar expression can be derived for maximum power, and it also contains the term $(V_B-V_p-V_T)$. Clearly, then, the maximum power output for both Class A and Class B operation is dependent on the maximum drain voltage, which depends on the gate-drain breakdown voltage.

In accordance with the invention, the breakdown voltage of a HEMT structure is significantly increased by the use of a current confinement technique, as shown in FIGS. 2a and 2b. Also, the transistor structure is modified in a novel manner to avoid any significant increase in the source-gate resistance and the saturation threshold voltage $V_T$.

FIG. 2a shows a single heterojunction HEMT structure of the prior art, including a semi-insulating substrate 20 on which is formed an undoped layer 22 of gallium arsenide and an overlying doped layer 24 of aluminum gallium arsenide. Overlying the doped layer 24 is a cap layer 26 of doped gallium arsenide. A gate electrode 2 extends through an opening in the cap layer 26 and contacts the doped aluminum gallium arsenide layer 24. A source contact 30 and a drain contact 32 are formed on the cap layer 26 on opposite sides of the gate electrode 28, with implanted source and drain contact regions extending through into the gallium arsenide layer 22 and through all of the intervening layers. In operation of the device, a two-dimensional electron gas forms on the gallium arsenide side of the junction between the layers 22 and 24, and forms the conductive channel for the device. The principal current path through the device is shown at 34 as being directly from the source contact 30, through the electron gas and directly to the drain contact 32. In practice, there are parallel leakage paths through the cap layer 26, as shown at 36. These paths have the effect of increasing the drain current and effectively lowering the voltage at which breakdown occurs and current begins to increase rapidly. As discussed above, a lower breakdown voltage results in a lower maximum output power for the device.

The same device is shown in FIG. 2b, but with the inclusion of a current confinement layer 38 of aluminum arsenide, between the doped aluminum gallium arsenide layer 24 and the cap layer 26. The effect of this layer is to practically eliminate leakage paths through the cap layer 26 and to increase the breakdown voltage significantly. In some designs, the breakdown voltage may be almost doubled.

The semiconductor AlAs current confinement layer 38 has an energy band-gap of 2.1 eV (electron-volts), in comparison to an energy band-gap of 1.8 eV for $Al_{0.3}Ga_{0.7}As$ and 1.43 for GaAs at room temperature. Electron confinement is achieved as a result of the conduction band energy discontinuity of AlAs with these smaller band-gap semiconductors.

An analogous concept to the use of an AlAs stop etch layer for electron confinement has been reported by T. Baba et al. in the Japanese Journal of Applied Physics, 22 (1983) L627, and 23 (1984) L654. These papers report the use of an AlAs/n-GaAs superlattice/GaAs structure, which also functions to confine electrons to an undoped GaAs channel in their structure.

Unfortunately, the addition of the current confinement layer 38 poses an additional problem in the operation of the device. The layer 38 impedes the flow of current from the source contact 30 to the electron gas in the undoped gallium arsenide layer 22. This increases the source resistance and also increases the threshold voltage $V_T$ at which the device saturates at maximum current. As is evident from equation (1) above, an increase in $V_T$ will lower the maximum radio-frequency power and, at least in part, counteract the increase in breakdown voltage provided by the effect of the current confinement layer 38. As will now be discussed with reference to FIGS. 3a-3f, this problem is avoided in the structure and method of the invention by alignment of the source contact 30 in close proximity to the gate electrode.

FIG. 3a shows the basic epitaxial structure used in the single heterojunction embodiment of the invention. This includes the substrate 20 of gallium arsenide, the buffer layer 22 of undoped gallium arsenide, a spacer layer 40 of undoped aluminum gallium arsenide formed over the buffer layer, the doped layer 24 of aluminum gallium arsenide formed over the spacer layer, the current confinement layer 38, which will also serve as a stop etch layer, formed over the doped aluminum gallium arsenide layer 24, and the cap layer 26 of doped gallium arsenide formed over the current confinement layer.

The buffer layer 22 in the single heterojunction structure may be as large as 8,000 angstroms (Å) thick. The spacer layer 40 may be in the range 20-35 Å thick and of undoped aluminum gallium arsenide ($Al_{0.3}Ga_{0.7}As$). The doped layer 24 may be silicon-doped $Al_{0.3}Ga_{0.7}As$ of an accurately controlled thickness in the range 300-400 Å. The stop etch layer 38 may be, for example, 60 Å, and the cap layer 26 is typically a few hundred angstroms thick.

Figure 3D:
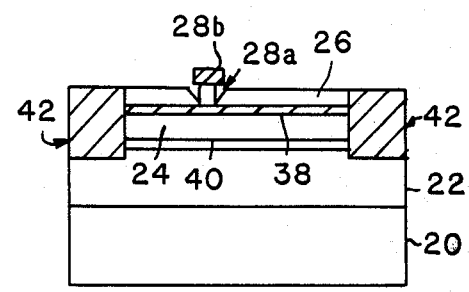
Figure 3B:
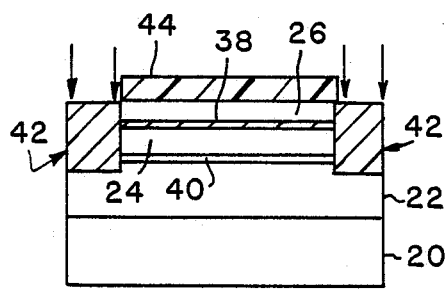

The first step in the fabrication process is, as shown in FIG. 3b, to define the region in which a device is to be formed. In the illustrated embodiment, this end is achieved by implanting oxygen ions into selected areas of the epitaxial structure, as indicated at 42. Preliminary to this step, a resist layer 44 is formed over the structure and is selectively etched by conventional photolithographic techniques, to define the regions in which the oxygen is to be implanted. After the implantation, the resist layer 44 is removed by an appropriate etchant. An alternative form of isolation is to form a mesa for each device to be defined on a chip wafer. The use of oxygen for isolation has the advantage of maintaining a planar configuration in the structure.

Figure 3E:
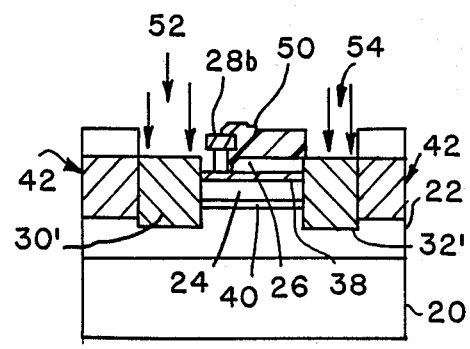
Figure 3C:
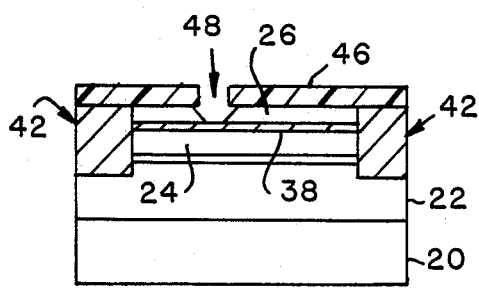

In the step shown in FIG. 3c, another resist layer 46 is formed over the structure, and is selectively etched to define a gate opening 48. The gate opening is etched down through the cap layer 26, but the etchant employed does not attack the stop etch layer 38. For example, a chemical etchant comprising $H_2O_2$ and $NH_4OH$ having a pH of 7 selectively removes any GaAs and AlGaAs having an aluminum mole fraction of at least 0.3 (15% aluminum), but does not etch AlAs. In the steps that follow, the gate electrode 28 is formed in contact with the stop etch layer 38. However, in another variant form of the invention, the gate electrode may be disposed in contact with the doped layer 24. In the latter case, a further etching step is required to extend the gate opening 48 through the stop etch layer 38. A suitable chemical etchant for this purpose is hydrogen fluoride (HF) buffered in $NH_4F$, which does not attack AlGaAs.

As shown in FIG. 3d, the gate electrode 28 is formed as a T-shaped element comprising refractory metal portion 28a in contact with the stop etch layer 38 and an overhanging gate mask portion 28b formed over the refractory metal. To form the gate electrode 28 in this form, the refractory metal, such as tungsten silicide, is deposited through the resist layer 46, to fill the gate opening 48. Then the gate mask portion 28b is formed over the gate metal, which is next etched from around the mask, and slightly undercut to form the T-shaped gate electrode 28. The etching step is preferably performed using a plasma etching process.

FIG. 3e shows the structure after implantation of a source contact region 30' and a drain contact region 32'. These regions are first defined in area by depositing and selectively etching another resist layer 50, to leave a source region opening 52 and a drain region opening 54. A critical aspect of this step is that the source region opening 52 is defined in part by the edges of the resist layer 50 and in part by one edge of the gate mask 28b. Silicon ions are then implanted through the openings 52 and 54, to form the implanted source contact region 30' and drain contact region 32', both of which extend through into the gallium arsenide buffer layer 22 and through all of the intervening layers. Rapid transient thermal annealing is employed to activate the implanted ions without alloying of the gate metal with the semiconductor and without degradation of the two-dimensional gas transport properties.

Figure 3F:
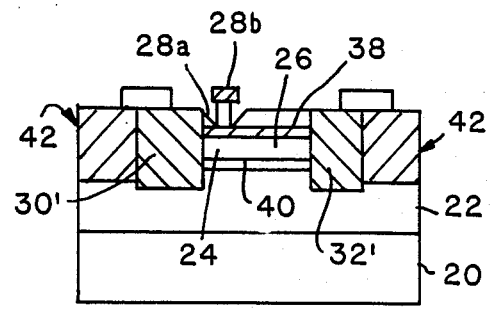

Finally, FIG. 3f shows the structure after the deposition of metal and alloy over the source and drain contact regions 30' and 32'. Metallization is performed using conventional process steps well known in the semiconductor fabrication art.

The use of deeply implanted source and drain contact regions assists in providing a direct current path from the source to the electron gas, and thence to the drain. However, the use of implanted source and drain regions does not, by itself, solve the problem arising from leakage currents through the cap layer 26. Only by the addition of the stop etch layer 38 is the current effectively confined to the two-dimensional electron gas at the heterojunction. The alignment of the source contact region 30' with the gate electrode 28 results in a minimization of the source resistance, and also prevents any increase in the saturation threshold voltage $V_T$ due to the presence of the stop etch layer.

To prevent a short circuit between the source contact region 30' and the gate electrode 28, the overhang of the gate mask 28b beyond the gate metal 28a provides the necessary spacing between the gate and the source contact region. This spacing need only be extremely small, for example $0.1\mu$ (micrometers) or 1,000 Å. An alternative approach to obtaining the necessary clearance between the source contact region 30' and the gate electrode 28 is to undercut the gate metal 28a after formation of the implanted source and drain contact regions.

The same technique described with reference to the single heterojunction structure of FIGS. 3a-3f applies just as well to structures with multiple heterojunctions. By way of example FIG. 4a shows the epitaxial structure used to fabricate a double heterojunction HEMT of the prior art. It includes an undoped gallium arsenide substrate 60 on which is formed an undoped gallium arsenide buffer layer 62 having a thickness of $0.2\mu$. Grown over the layer 62 is a $0.2\mu$ layer 64 of undoped aluminum gallium arsenide, and then a 100 Å layer 66 of doped aluminum gallium arsenide. Then follows a first spacer layer 68 consisting of 35 Å thickness of undoped aluminum gallium arsenide, and a layer, 300 Å thick, of undoped gallium arsenide 70. Grown over the last-mentioned layer 70 is another 35 Å spacer layer 72 of undoped aluminum gallium arsenide, and then a 300 Å thick layer 74 of doped aluminum gallium arsenide. Finally, there is a cap layer 76 of doped gallium arsenide of thickness 200 Å. Two two-dimensional electron gas layers are formed at the heterojunctions, as indicated by the broken lines in FIG. 4a.

Figure 5A:
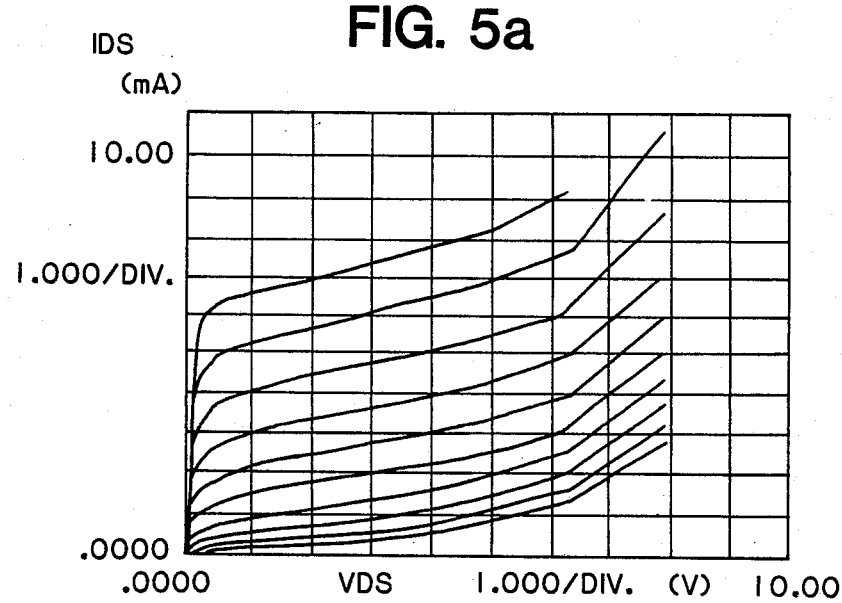
FIGS. 5a and 5b are sets of characteristic curves showing the relationship between drain current and drain-source voltage for the two structures shown in FIGS. 4a and 4b, respectively.

The characteristic current-voltage curves for a HEMT device fabricated using the structure of FIG. 4a are shown in FIG. 5a. The breakdown voltage is apparent at the point at which the saturated current values begin increasing sharply with voltage. This is at a voltage level of about 8 volts.

Figure 5B:
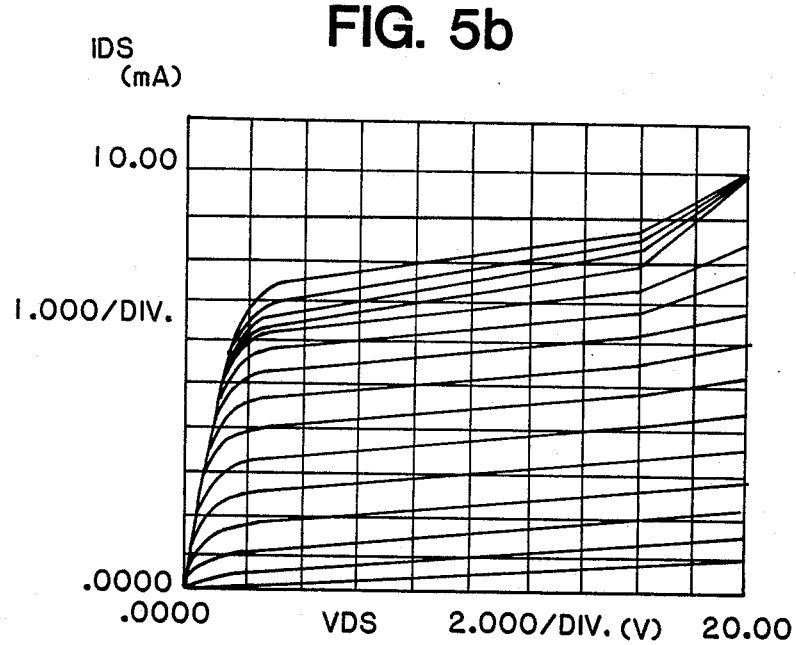

FIG. 4b shows an epitaxial structure like that of FIG. 4a, except that an additional layer 78 has been included. This is the stop etch layer, in this case a 60 Å thick layer of aluminum arsenide formed between the doped aluminum gallium arsenide layer 74 and the cap layer 76. The resulting current-voltage curves for a HEMT device fabricated using the epitaxial structure of FIG. 4b is shown in FIG. 5b. It will be observed that the breakdown voltage is in this case at a level of about 13 volts, an increase of more than sixty percent.

It will be appreciated from the foregoing that the present invention represents a significant advance in the field of HEMT structures for high power applications. In particular, the invention provides a transistor with a much higher maximum power output than was available prior to the invention. The higher power output results from a higher breakdown voltage obtained by use of the stop etch layer in the structure to confine current principally to the electron gas layer forming the intended current channel for the device. The maximum power output density available from HEMT structures prior to this invention have typically been limited to about 0.5 watt/mm. The structure of the invention provides maximum power output densities of approximately 1.0 watt/mm over a wide range of frequencies of operation.

It will also be appreciated that, although several embodiments of the invention have been described in detail for purposes of illustration, various modifications may be made without departing from the spirit and scope of the invention. Accordingly, the invention is not to be limited except as by the appended claims.

I claim:
1. A high electron mobility transistor, comprising:
 a layer of undoped gallium arsenide;

an overlying layer of aluminum gallium arsenide, forming a heterojunction with the layer of undoped gallium arsenide;

an electrical barrier layer directly overlying the layer of aluminum gallium arsenide, the electrical barrier layer having a wider energy band-gap than the layer of aluminum gallium arsenide;

a cap layer overlying the electrical barrier layer;

a gate electrode formed in an opening in the cap layer; and source and drain contact means containing the aluminum gallium arsenide layer on opposite sides of the gate electrode;

wherein the wider energy band-gap of the electrical barrier layer provides a barrier to leakage electron paths through the cap layer, thereby increasing the gate-drain breakdown voltage and the maximum power output of the transistor;

and wherein the source contact means is disposed close to the gate electrode to minimize source resistance, and the drain contact means is more widely spaced from the gate electrode.

2. A high electron mobility transistor, comprising:

a layer of undoped gallium arsenide;

an overlying layer of aluminum gallium arsenide, forming a heterojunction with the layer of undoped gallium arsenide;

an electrical barrier layer directly overlying the layer of aluminum gallium arsenide, the electrical barrier layer being of undoped aluminum arsenide and having a wider energy band-gap than the layer of aluminum gallium arsenide;

a cap layer overlying the electrical barrier layer;

a gate electrode formed in an opening in the cap layer; and source and drain contact means contacting the aluminum gallium arsenide layer on opposite sides of the gate electrode;

wherein the wider energy band-gap of the electrical barrier layer provides a barrier to leakage electron paths through the cap layer, thereby increasing the gate-drain breakdown voltage and the maximum power output of the transistor;

and wherein the source contact means is disposed close to the gate electrode to minimize source resistance, and the drain contact means is more widely spaced from the gate electrode.

3. A high electron mobility transistor as defined in claim 1, wherein:

the gate electrode has a refractory metal portion deposited in the gate opening and an overlying gate mask portion that is longer than the refractory metal portion;

wherein the source contact means is aligned with an edge of the gate mask portion, and the shorter length of the refractory metal portion provides a necessary clearance between the gate electrode and the source contact means.

4. A high electron mobility transistor as defined in claim 1, wherein:

the gate electrode extends through the electrical barrier layer to contact the aluminum gallium arsenide layer.

5. A high electron mobility transistor as defined in claim 1, and further including:

a spacer layer disposed between the undoped gallium arsenide layer and the doped aluminum gallium arsenide layer.

6. A double heterojunction high electron mobility transistor, comprising:

a semi-insulating semiconductor substrate;

an undoped buffer layer of gallium arsenide formed over the buffer layer;

an undoped aluminum gallium arsenide layer formed over the buffer layer;

a first doped layer of aluminum gallium arsenide formed over the last-mentioned undoped layer;

a first spacer layer of undoped aluminum gallium arsenide formed over the first doped layer of aluminum gallium arsenide;

a layer of undoped gallium arsenide formed over the first spacer layer, forming a first heterojunction with the first spacer layer;

a second spacer layer formed over the undoped gallium arsenide layer, forming a second heterojunction with the undoped gallium arsenide layer;

a second doped layer of aluminum gallium arsenide formed over the second spacer layer;

an electrical barrier layer of aluminum arsenide formed directly over the second doped layer of aluminum gallium arsenide, the electrical barrier layer having a wider energy band-gap than the layers of aluminum gallium arsenide;

a cap layer formed over the electrical barrier layer;

a gate electrode deposited in a gate opening in the cap layer;

source contact means formed in the structure and extending down to at least the undoped gallium arsenide layer, the source contact means being located in close proximity to but not in contact with the gate electrode; and drain contact means formed in the structure on the opposite side of the gate electrode from the source contact means;

wherein the wider energy band-gap of the electrical barrier layer provides a barrier to leakage electron paths through the cap layer, thereby increasing the gate-drain breakdown voltage and the maximum power output of the transistor.

7. A double heterojunction high electron mobility transistor as defined in claim 6, wherein:

the undoped buffer layer is approximately 0.2 microns thick; and the undoped aluminum gallium arsenide layer is approximately 0.2 microns thick.

8. A double heterojunction high electron mobility transistor as defined in claim 6, wherein:

the first doped aluminum gallium arsenide layer is approximately 100 Å (angstroms) thick;

the undoped gallium arsenide layer is approximately 300 Å thick; and the second doped aluminum gallium arsenide layer is approximately 300 Å thick.

9. A double heterojunction high electron mobility transistor as defined in claim 8, wherein:

the first and second spacer layers are approximately 35 Å thick.

10. A double heterojunction high electron mobility transistor as defined in claim 9, wherein:

the cap layer is doped gallium arsenide of approximately 200 Å thickness.

11. A double heterojunction high electron mobility transistor as defined in claim 6, wherein:

the thickness of the electrical barrier layer is approximately 60 Å.

* * * * *